United States Patent
Dugas et al.

(10) Patent No.: US 10,062,666 B2
(45) Date of Patent: Aug. 28, 2018

(54) CATCH FLEXURE SYSTEMS, DEVICES AND METHODS

(71) Applicant: Advanced Research Corporation, White Bear Lake, MN (US)

(72) Inventors: Matthew Phillip Dugas, North Oaks, MN (US); Steven Brian Ellison, Woodbury, MN (US); Gregory Lawrence Wagner, Arden Hills, MN (US)

(73) Assignee: ADVANCED RESEARCH CORPORATION, White Bear Lake, MN (US)

( * ) Notice: Subject to any disclaimer, the term of this patent is extended or adjusted under 35 U.S.C. 154(b) by 0 days.

(21) Appl. No.: 15/339,608

(22) Filed: Oct. 31, 2016

(65) Prior Publication Data
US 2017/0125384 A1 May 4, 2017

Related U.S. Application Data

(60) Provisional application No. 62/249,014, filed on Oct. 30, 2015.

(51) Int. Cl.
*H01L 25/065* (2006.01)

(52) U.S. Cl.
CPC *H01L 25/0657* (2013.01); *H01L 2225/06506* (2013.01)

(58) Field of Classification Search
CPC .................................................. H01L 25/0657
See application file for complete search history.

(56) References Cited

U.S. PATENT DOCUMENTS

| 4,615,573 | A | 10/1986 | White et al. |
| 5,607,818 | A | 3/1997 | Akram et al. |
| 5,625,298 | A | 4/1997 | Hirano et al. |
| 5,689,317 | A | 11/1997 | Miller |
| 5,716,218 | A | 2/1998 | Farnworth et al. |
| 5,763,941 | A | 6/1998 | Fjelstad |

(Continued)

OTHER PUBLICATIONS

Li, D., Light, D., Castillo, D., Beroz, M., Nguyen, M. And Wang, T. (2001). A Wide Area Vertical Expansion (WAVE TM) Packaging Process Development. Tessera, Inc.., San Jose, CA. 2001 Electronic Components and Technology Conference.

(Continued)

*Primary Examiner* — Errol Fernandes
(74) *Attorney, Agent, or Firm* — Thomas | Horstemeyer, LLP

(57) ABSTRACT

Various systems, devices and methods are provided for interconnection between wafers and/or chips using catch flexures. In one example, among others, a catch flexure assembly includes a first interconnect affixed to a first wafer. The first interconnect can include a female opening at a distal end of a flexible member that is configured to receive a male extension of a second interconnect affixed to a second wafer when the first wafer is aligned with the second wafer, and retain the male extension during a bonding process of the first and second flexible interconnects. The catch flexure assembly can also include bonding material disposed adjacent to the female opening, which is configured to secure the male extension in the female opening during the bonding process.

16 Claims, 11 Drawing Sheets

(56) References Cited

U.S. PATENT DOCUMENTS

| | | | |
|---|---|---|---|
| 5,810,609 | A | 9/1998 | Faraci et al. |
| 5,869,974 | A | 2/1999 | Akram et al. |
| 5,893,727 | A | 4/1999 | Lau et al. |
| 5,949,133 | A | 9/1999 | Wojnarowski |
| 6,007,349 | A | 12/1999 | Distefano et al. |
| 6,063,648 | A | 5/2000 | Beroz et al. |
| 6,068,669 | A | 5/2000 | Farnworth et al. |
| 6,183,675 | B1 | 2/2001 | Brown et al. |
| 6,333,255 | B1 | 12/2001 | Sekiguchi |
| 6,399,900 | B1 | 6/2002 | Khoury et al. |
| 6,617,865 | B2 | 9/2003 | Di Stefano |
| 6,784,378 | B2 | 8/2004 | Zhu et al. |
| 6,830,461 | B2 | 12/2004 | Sakamoto et al. |
| 6,872,345 | B1 | 3/2005 | Yustick |
| 6,890,185 | B1 | 5/2005 | Kister et al. |
| 6,994,565 | B2 | 2/2006 | Harper, Jr. |
| 7,378,742 | B2 | 5/2008 | Muthukumar et al. |
| 7,507,656 | B2 | 3/2009 | Chen |
| 8,069,578 | B1 | 12/2011 | Wright, IV |
| 8,206,160 | B2 | 6/2012 | Kacker et al. |
| 8,382,489 | B2 | 2/2013 | Kacker et al. |
| 8,766,449 | B2 | 7/2014 | Sitaraman et al. |
| 2002/0118515 | A1 | 8/2002 | Zhu et al. |
| 2004/0051173 | A1 | 3/2004 | Koh et al. |
| 2006/0197232 | A1 | 9/2006 | Tay et al. |
| 2008/0245559 | A1 | 10/2008 | Sitaraman et al. |
| 2008/0305653 | A1 | 12/2008 | Kacker et al. |
| 2010/0279076 | A1 | 11/2010 | Kim |
| 2011/0101714 | A1 | 5/2011 | Bator |
| 2012/0217610 | A1* | 8/2012 | Hopper ............ H01L 21/76898 257/506 |

OTHER PUBLICATIONS

Lunyu, M., Sitaraman, S.K., Chua, C., and Fork, D.K. (2001). Compliant Cantilevered Spring Interconnects for Flip- Chip Packaging. Computer-Aided Simulation of Packaging Liao, E.B., Tay, A.A.O., Ang, S.S.T., Feng, H.H., Nagarajan, R., Kripesh, V., Kumar, R. and Iyer, M.K. (2006).

Liao, E.B., Tay, A.A.O., Ang, S.S.T., Feng, H.H., Nagarajan, R., Kripesh, V., Kumar, R. And Iyer, M.K. (2006). A MEMS-Based Compliant Interconnect for Ultra-Fine-Pitch Wafer Level Packaging.

Zhu, Q., Ma, L., and Sitaraman, S.K. (2003). Design Optimization of One-Turn Helix: A Novel Compliant Off-Chip Interconnect. Interconnect Focus Center Research Program. Georgia Institute of Technology and Semiconductor Research Corporation. Digital Object Identifier: 10.1109/TADVP.2003.817343.

Bhansali, S., Chapman, G.H., Friedman, E., Ismail, Y., Mukund, P.R. and Tebbe, D., Jain, V. (2004). 3D Heterogeneous Sensor System on a Chip for Defense and Security Applications. Unattended/Unmanned Ground, Ocean, and Air Sensor Technologies and Applications VI, edited by Edward M. Carapezza, Proc. of SPIE vol. 5417 (SPIE, Bellingham, WA, 2004).

Qi Zhu, Lunyu Ma, and Suresh K. Sitaraman; Mechanical and Preliminary Electrical Design of a Novel Compliant One-Turn Helix (OTH) Interconnect; Jul. 8-13, 2001; pp. 1-6.

Lunyu Ma, Qi Zhu, and Suresb Sitaraman; Alternative Compliant Interconnects—Thermo-Mechanical Reliability, Design and Testing; Nov. 11-16, 2001; pp. 1-10.

Kacker, K., et al., "FlexConnects: A Cost-Effective Implementation of Compliant Chip-to-Substrate Interconnects," Proc. of Electronic Components and Technology Conference, Reno, NV, May 29, 2007-Jun. 1, 2007, pp. 1678-1684.

Zhu, Q., et al., "Development of Ghelix structure as off-chip Interconnect," Transactions of the ASME—Journal of Electronic Packaging, vol. 126, pp. 237-246, Jun. 2004.

Lo, G., et al. "G-Helix: Lithography-Based Wafer-Level Compliant Chip-to-Substrata Interconnects," Proc. of 54th Electronic Components and Technology Conference, Las Vegas, NV, Jun. 2004, pp. 320-325.

Kackar, K., et al. "Assembly and Reliability Assessment of Lithography-Based Wafer-Level Compliant Chip-to-Substrate Interconnects" Proc of. 55th Electronic Components and Technology Conference, Orlando, FL, 2005, pt. 1, pp. 545-550.

Philip G, Christopher B, Ramm P "Handbook of 3D integration: technology and applications of 3D integrated circuits," vol. 1 and 2, Chapter 15, Wiley-VCH, New York, 2008.

Philip G, Christopher B, Ramm P "Handbook of 3D integration: technology and applications of 3D integrated circuits," vol. 3, Chapter 1, Wiley-VCH, New York, 2008.

\* cited by examiner

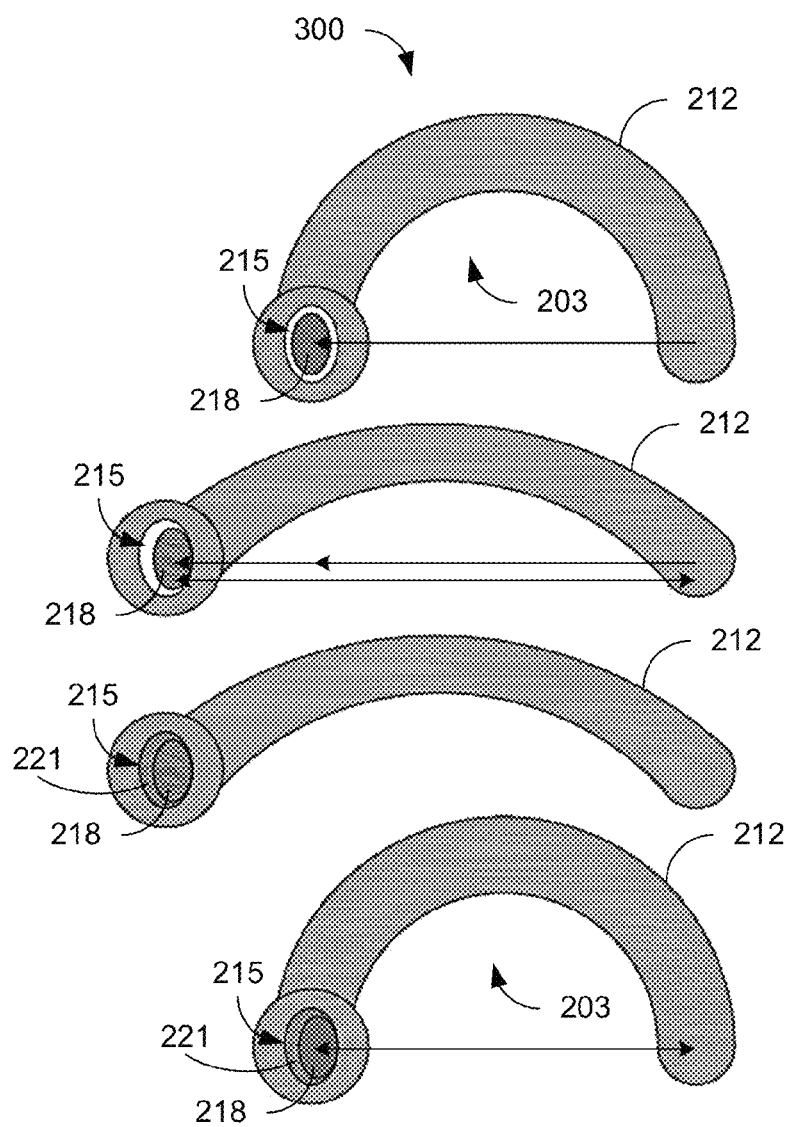

CATCH FLEXURE SYSTEMS, DEVICES AND METHODS

CROSS REFERENCE TO RELATED APPLICATIONS

This application claims priority to, and the benefit of, U.S. provisional application entitled "Catch Flexure Systems, Devices and Methods" having Ser. No. 62/249,014, filed Oct. 30, 2015, which is hereby incorporated by reference in its entirety.

BACKGROUND

Three-dimensional integrated circuits based on vertical integration of wafers and/or dies offers benefits in electrical performance, power reduction and smaller footprint area. With the advent of silicon wafer-to-wafer (and earlier chip-to-chip) stacking, various homogeneous wafer bonding systems have been achieved using wire bonding and flip chip techniques. However, additional complexities are introduced where the wafers or dies are made of different substrate materials having different coefficients of thermal expansion (CTE). The situation is compounded when high density interconnects are needed between the wafers.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5A-5D graphically illustrate the mechanical states of a catch flexure of FIGS. 2A and 2B during a bonding process, in accordance with various embodiments of the present disclosure.

FIGS. 7A-7D graphically illustrate the mechanical states of a catch flexures of FIGS. 3A-3C and 4A-4C during a bonding process, in accordance with various embodiments of the present disclosure.

DETAILED DESCRIPTION

Figure 1A:
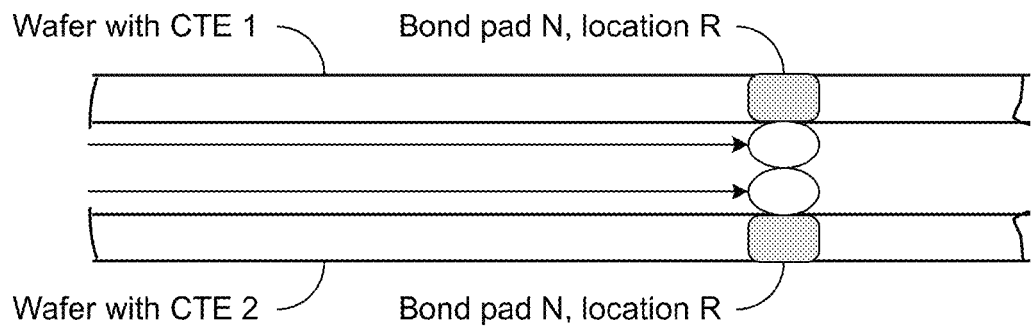
FIGS. 1A and 1B graphically illustrate the effect of thermal expansion on wafers with different CTEs, in accordance with various embodiments of the present disclosure.

Disclosed herein are various embodiments of methods related to catch flexure systems, devices and methods, which may be used for heterogeneous wafer-to-wafer bonding. Reference will now be made in detail to the description of the embodiments as illustrated in the drawings, wherein like reference numbers indicate like parts throughout the several views.

Bonding between heterogeneous wafers presents a variety of design considerations. One problem includes matching wafers made of different substrate materials such as, e.g., silicon (Si), gallium arsenide (GaAs), indium phosphide (InP), sapphire and gallium nitride (GaN), which have different coefficients of temperature expansion (CTE). This is further complicated when doing so with a high interconnect density across 150 mm wafers. While several flexible interconnect schemes have been useful over a small range of process and operational temperatures, none of these flexible interconnect schemes address the issues that occur during heterogeneous substrate bonding using a high temperature process. This involves the initial room temperature alignment of the interconnections in combination with the wafer bonding process at an elevated temperature.

Figure 1B:
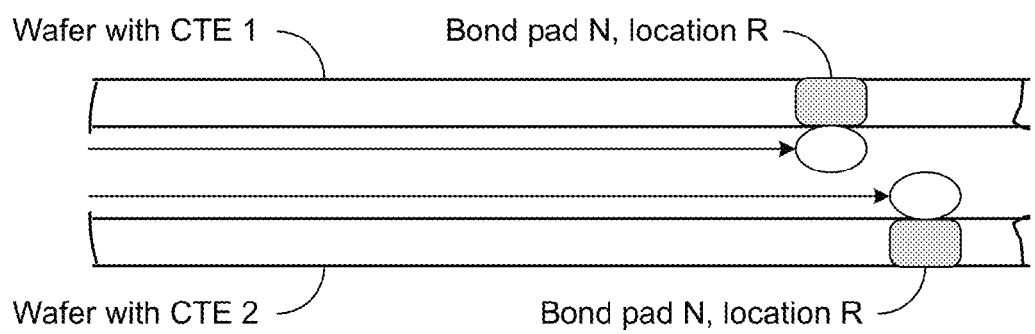

The effect of different CTEs is graphically illustrated in FIGS. 1A and 1B. As shown in FIG. 1A, the initial alignment of the bond pads is done at room temperature ($T_{room}$), whereas the elevated bonding is up to 400 C. higher. The wafers can be pinned if they have the same CTE, however if the CTEs are different for the two wafers then the bond pads will be misaligned at the elevated bonding temperature ($T_{bond}$) as shown in FIG. 1B. The related differential thermal expansion induced motion makes the original alignment impossible to maintain using the current schemes. The catch flexure disclose herein offers the ability to align the interconnections between the heterogeneous wafers and/or dies and accommodate the thermal expansion resulting from high temperature bonding and its subsequent cool down.

For instance, in infrared focal plane array (IR FPA) systems, the detector chip has a substrate of cadmium zinc telluride (CdZnTe) with an epi-layer of mercury cadmium telluride (HgCdTe), which is bonded face-to-face (FTF) with a complementary metal-oxide-semiconductor (CMOS) silicon substrate readout integrated circuit (ROIC). For these cooled IR camera systems, the bonding material is generally indium (In), which exhibits remarkable compliance down to liquid helium temperatures. Indium is a good choice for cold compression bonding. With 200 kg alignment/bonding systems such as, e.g., Smart Equipment Technology (SET) FC 150 and FC 300 machines, extremely high density In bumps can be compression bonded at room temperature.

Alignment and bonding at one temperature removes the misalignment from the CTE issue while the tall indium bumps provide excellent electrical and mechanical connections over the range of temperatures experienced during IR FPA operation. IR FPA systems are cooled during operation to reduce the background IR noise, with the operational temperatures generally extending from room temperature down to about 77K. The strain from the differential shrinkage is taken care of by the Indium bumps. However for chips that operate at temperatures of 100° C. or higher, indium is not the best choice as its melting point is 156° C. and it simply is not stable enough for chips which operate or are tested at these higher temperatures.

The use of cold welding can remove the alignment mismatch as the two different materials are designed to be aligned at room temperature, however the use of cold welding or compression bonding with indium has many other issues that make it a poor choice for a wide range of applications. Indeed, for high density IR imaging the number of pixels are getting to be so large (e.g., over 2 million and getting larger) that the cold welding systems may not be an option for the next generation of IR FPA devices.

The disclosed methods, systems and devices can facilitate the fabrication of very complex multi-wafer heterogeneous wafer stacks, while allowing the use of many different kinds of bonding and solder materials, including indium. The catch flexure approach provides virtual decoupling of the CTE mismatch, allowing it to be well-managed from the initial alignment to bonding and back over the entire operating temperature range of the system, and does so with only minimal residual stress on any given wafer area. This ability allows for ever more complex highly integrated systems with smaller size, weight, power and cost. With the catch flexure, compound semiconductor and elemental semiconductors and other wafer systems can be co-mingled into multi-wafer stacks of devices and systems. In addition to wafer-to-wafer bonding, the catch flexure can be used for chip-to-chip level bonding and combinations thereof.

The catch flexure provides wafer connectivity through the use of a MEMS based flexure system with a catch mechanism, which can be achieved through a variety of configurations. For example, hooks or specially shaped ends, gendered pairs of flexures, and/or at least with 1 flexure with a pinned coupling to the pad end of the other wafer can be used. The catch mechanism maintains mechanical coupling while simultaneously allowing for relatively large planar and relatively small vertical displacement to occur. In one embodiment, among others, a catch flexure assembly includes a gendered coupled pair of flexures with different gender catch mechanisms, one gender for the upper wafer and one gender for the lower wafer. The catch mechanism can allow the system to remain in contact, while providing enough freedom of motion to take up the CTE mismatch during temperature changes.

Figure 2A:
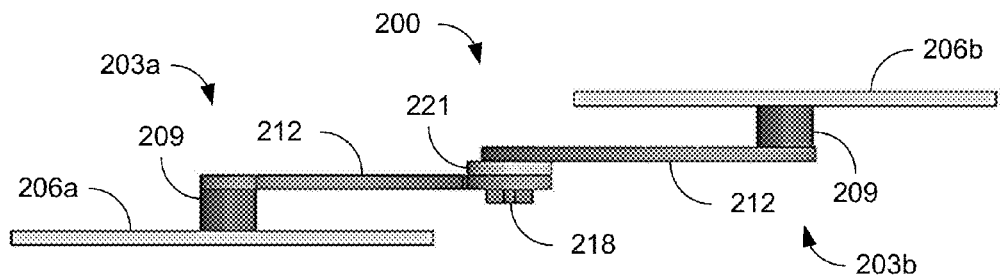
FIGS. 2A and 2B are graphical representations illustrating side and perspective views, respectively, of an example of a catch flexure, in accordance with various embodiments of the present disclosure.
Figure 2B:
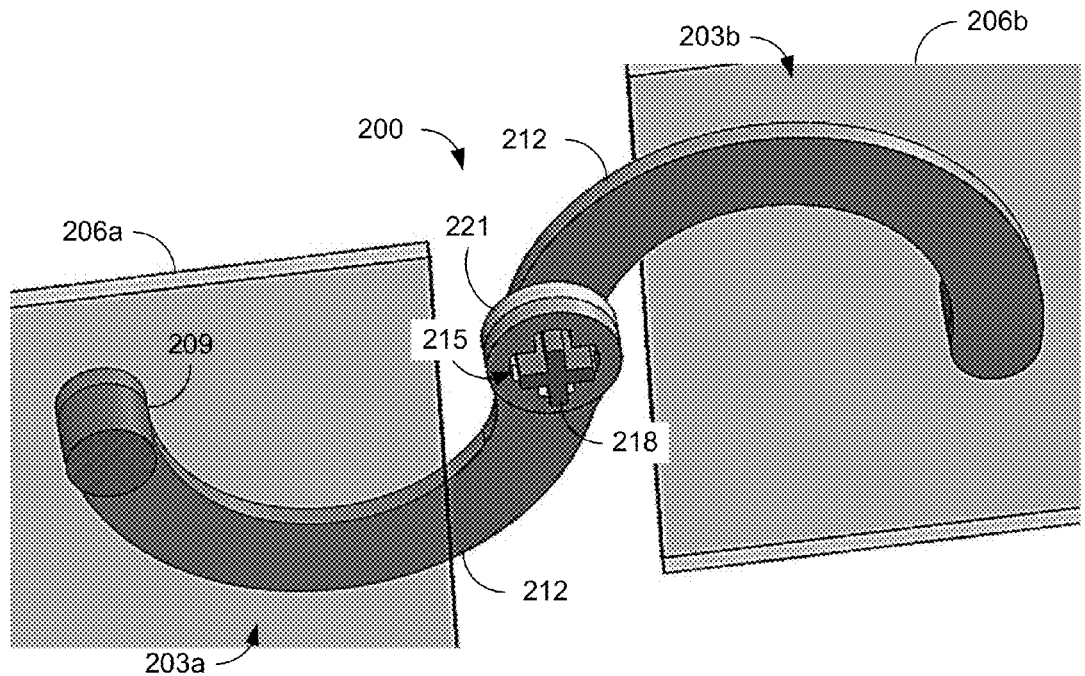

Referring to FIGS. 2A and 2B, shown are graphical representations of side and perspective views, respectively, of an example of a catch flexure 200 that allows for alignment at $T_{room}$ using a male-female interlocking flexure system. In the example of FIGS. 2A and 2B, a first interconnect 203a is affixed to a first wafer 206a and a second interconnect 203b is affixed to a second wafer 206b. The first and second interconnects 203 can be affixed to their respective wafer 206 through a mounting post 209 located at a proximal end of a flexible member 212. The flexible members 212 can extend substantially parallel with the surface of the corresponding wafer 203. Catch mechanisms at the distal end of the flexible members are configured to couple the two interconnects 203 together and maintain contact during relative movement between the wafers 206.

The catch mechanism of the first interconnect 203a includes a female opening 215 configured to receive a male extension 218 of the catch mechanism of the second interconnect 203b. The male extension 218 and female opening 215 have corresponding shapes configured to align with each other and restrict rotation of the male extension 218 within the female opening 215. The female opening 215 can include clearance to allow for alignment of the male extension 218 in the female opening 215 during insertion or coupling. In some implementations, a thermal slip fit may be used to allow insertion of the male extension 218 in the female opening 215 with a reduced clearance when cooled. A bonding agent 221 can be used to fix the male extension 218 in the female opening 215 during bonding of the wafers 206. The bonding agent 221 can be a bonding metal or other suitable bonding material such as, but not limited to, gold (Au), gold tin (AuSn) such as eutectic AuSn, tin lead (SnPb), indium (In), etc. The bonding agent 221 can be disposed on one or both of the catch mechanisms prior to insertion of the male extension 218 into the female opening 215. With the bonding agent in or adjacent to the female opening 215, heating during wafer bonding allows the bonding agent 221 to flow into the gap between the female opening 215 and male extension 218, thereby fixing it in position.

In the example of FIGS. 2A and 2B, the male extension 218 is a cross-post (having a cross-sectional shape of a cross) extending from the distal end of the flexible member 212. The female opening 215 has a corresponding cross-shaped opening configured to align with the cross-post when the catch mechanisms are engaged. While FIGS. 2A and 2B show a cross-shaped post and opening with even extensions (e.g., "×" or "+"), other cross-sectional shapes can be utilized. For example, the male extensions 218 and female opens 215 can be shaped as crosses with uneven extensions, stars, ellipses, rectangles, or other geometric shapes can be used (see, e.g., FIGS. 6A and 6B). In some implementations, hooks with our without handedness may be used as the catch mechanisms.

Figure 3A:
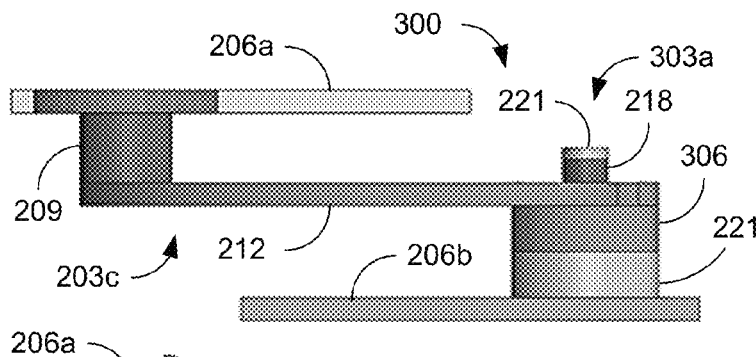
FIGS. 3A-3C and 4A-4C are graphical representations illustrating side, perspective and cross-sectional views, respectively, of examples of catch flexures, in accordance with various embodiments of the present disclosure.
Figure 3B:
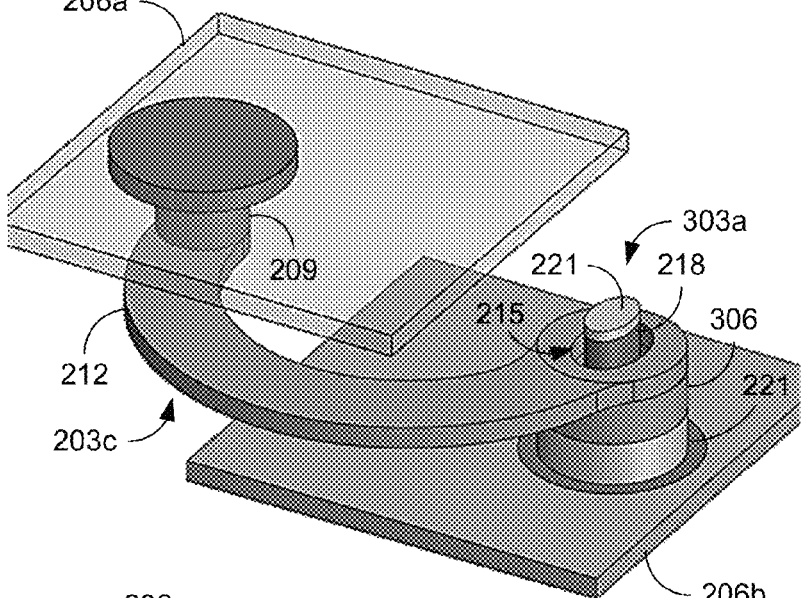
Figure 3C:
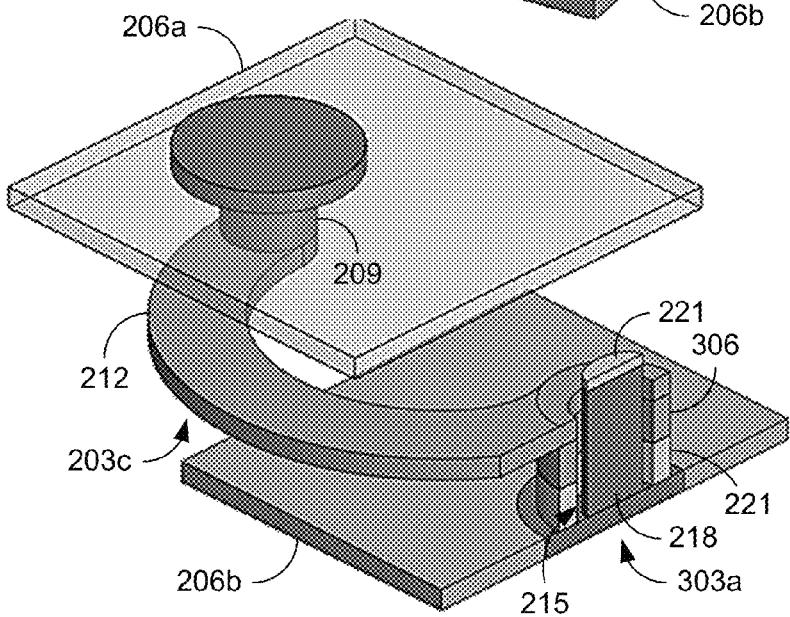

Referring next to FIGS. 3A-3C and 4A-4C, shown are examples of catch flexures 300 that include a single flexible member 212. In the example of FIGS. 3A-3C, a first interconnect 203c is affixed to a first wafer 206a and a second interconnect 303a is affixed to a second wafer 206b. The first interconnect 203c can be affixed to the first wafer 206a through a mounting post 209 located at a proximal end of the flexible member 212, which can extend substantially parallel with the surface of the first wafer 203c. The first interconnect 203c includes a through catch mechanism at the distal end of the flexible member 212 that allows a male extension 218 to pass through and extend beyond the top of the catch mechanism. The through catch mechanism includes a sleeve 306 that extends substantially perpendicular to the flexible member 212 with a female opening 215 extending through the catch mechanism.

The catch mechanism of the second interconnect 303a includes the male extension 218 that extends substantially perpendicular from the surface of the second substrate 206b. The catch mechanisms are configured to couple the two interconnects 203c and 303a together and maintain contact during relative movement between the wafers 206. In the example of FIGS. 3A-3C, the male extension 218 is an oval-shaped post (having a cross-sectional shape of an oval). The female opening 215 has a corresponding oval-shaped opening configured to align with the oval-shaped post when the catch mechanisms are engaged. The male extension 218 and female opening 215 have corresponding shapes configured to align with each other and restrict rotation of the male extension 218 within the female opening 215. The female opening 215 can include clearance to allow for alignment of the male extension 218 in the female opening 215 during insertion or coupling. In some implementations, a thermal slip fit may be used to allow insertion of the male extension 218 in the female opening 215 with a reduced clearance when cooled.

A bonding agent 221 can be used to fix the male extension 218 in the female opening 215 during bonding of the wafers 206. The bonding agent 221 can be disposed on one or both of the catch mechanisms prior to insertion of the male extension 218 into the female opening 215. In the example of FIGS. 3A-3C, the bonding agent 221 is located on a free end of the sleeve 306 around the female opening 215 and on the free end of the male extension 218. Heating during wafer bonding allows the bonding agent 221 to flow into the gap between the female opening 215 and male extension 218, thereby fixing it in position.

Figure 4A:
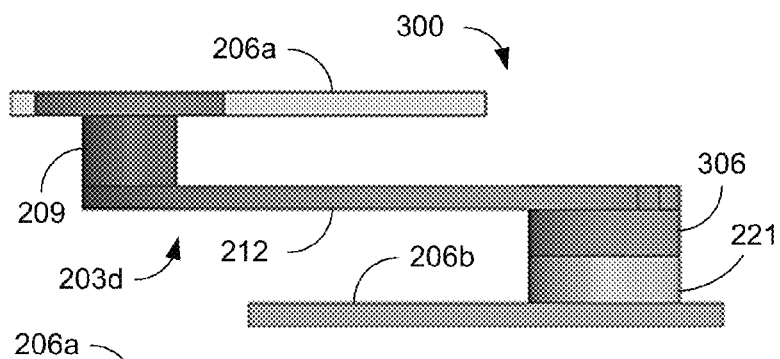
Figure 4B:
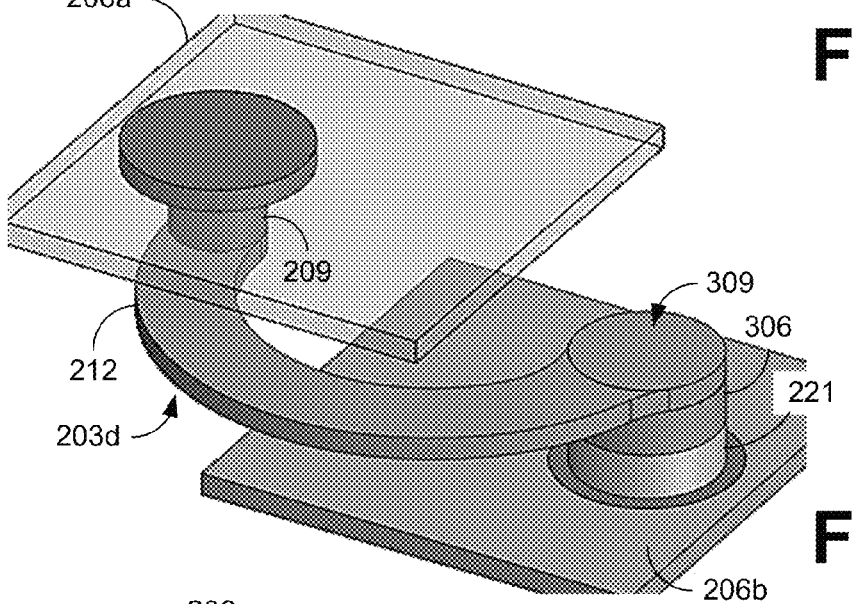
Figure 4C:
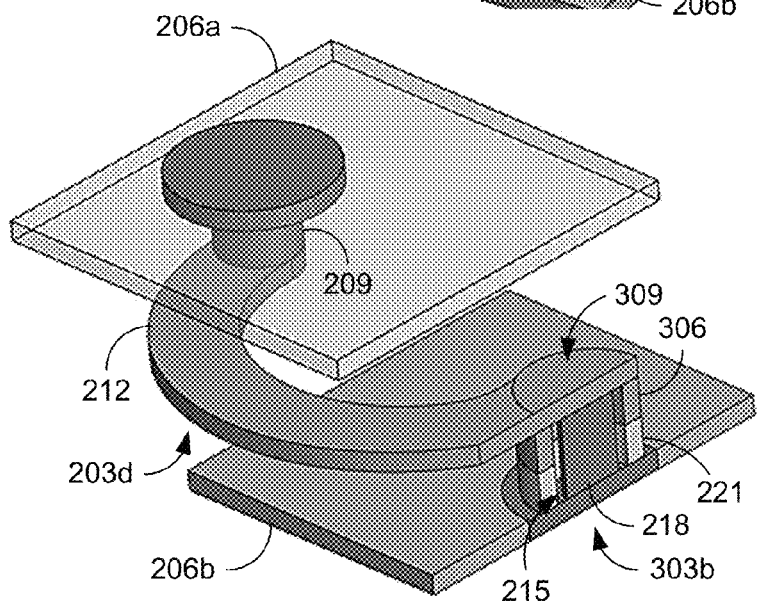

In the example of FIGS. 4A-4C, a first interconnect 203d is affixed to a first wafer 206a and a second interconnect 303b is affixed to a second wafer 206b. The first interconnect 203d can be affixed to the first wafer 206a through a mounting post 209 located at a proximal end of the flexible member 212, which can extend substantially parallel with the surface of the first wafer 203d. The first interconnect 203d includes a blind catch mechanism at the distal end of the flexible member 212 that allows a male extension 218 to extend into the female opening 215 of the catch mechanism. The blind catch mechanism includes a sleeve 306 that extends substantially perpendicular to the flexible member 212 with a female opening 215 extending through the catch mechanism until reaching a cap 309 closing off the end of the sleeve 306 at the flexible member 212.

The catch mechanism of the second interconnect 303b includes the male extension 218 that extends substantially perpendicular from the surface of the second substrate 206b. The catch mechanisms are configured to couple the two interconnects 203d and 303b together and maintain contact during relative movement between the wafers 206. In the example of FIGS. 4A-4C, the male extension 218 is an oval-shaped post (having a cross-sectional shape of an oval). The female opening 215 has a corresponding oval-shaped opening configured to align with the oval-shaped post when the catch mechanisms are engaged. The male extension 218 and female opening 215 have corresponding shapes configured to align with each other and restrict rotation of the male extension 218 within the female opening 215. The female opening 215 can include clearance to allow for alignment of the male extension 218 in the female opening 215 during insertion or coupling. In some implementations, a thermal slip fit may be used to allow insertion of the male extension 218 in the female opening 215 with a reduced clearance when cooled.

A bonding agent 221 can be used to fix the male extension 218 in the female opening 215 during bonding of the wafers 206. The bonding agent 221 can be disposed on one or both of the catch mechanisms prior to insertion of the male extension 218 into the female opening 215. In the example of FIGS. 4A-4C, the bonding agent 221 is located on a free end of the sleeve 306 around the female opening 215, such that it encircles the fixed end of the male extension 218 when coupled together. Heating during wafer bonding allows the bonding agent 221 to flow into the gap between the female opening 215 and male extension 218, thereby fixing it in position.

The catch flexure 200 having two flexible members 212, such as in FIGS. 2A and 2B, offers attributes lacking in current compliant interconnect concepts. The catch flexure 200 includes catch mechanisms that interlock during the standard alignment step of the wafers, and the interlocked connection is maintained from room temperature up to the bonding temperature. Once the bonding thermal soak time is completed, the catch flexure 200 retains permanent connectivity while accounting for the stress in the keyed joint as the wafer system returns to ambient temps.

FIGS. 5A-5D are schematic diagrams illustrating the ability of the catch flexure 200 to adjust for the thermal expansion of the wafers 206 during the bonding process. FIGS. 5A-5D show examples of the mechanical state of the catch flexure as a function of temperature. In FIG. 5A, the catch mechanisms of the catch flexure 200 are aligned during assembly of the wafers 206 at $T_{room}$. As shown, the cross-post of the male extension 218 aligns with the cross-shaped opening of the female opening 215. The initial distance between the mounting posts 209 is indicated. As the temperature is increased to $T_{bond}$ during the bonding process, the catch flexure 200 may be stretched because of the different CTEs. FIG. 5B illustrates the increased distance between the mounting posts 209 produced by the different thermal expansions. As shown, the alignment of the cross-post in the cross-shaped opening can vary as the temperature increases to $T_{bond}$. As can be understood, the distance between the mounting posts 209 will vary for different wafer locations. Each point of the wafers 206 can have a unique expansion differential, which can be accounted for by the catch mechanisms.

Figure 6A:
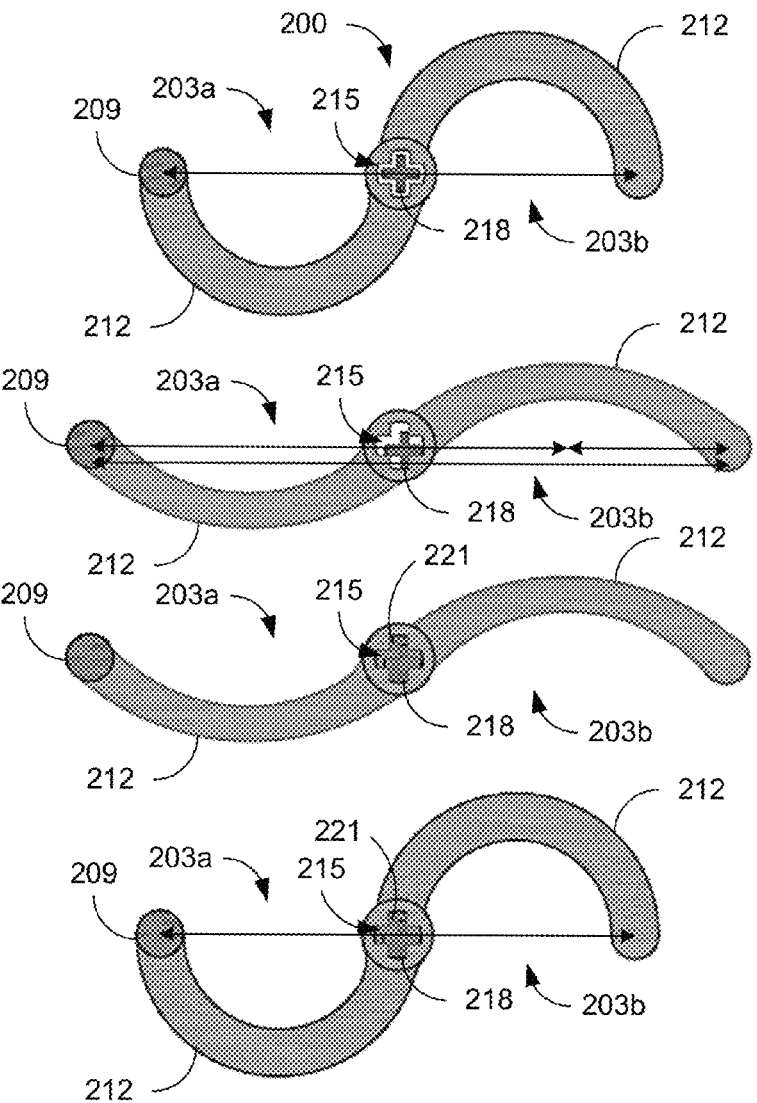
FIGS. 6A and 6B illustrate examples of catch mechanism geometries, in accordance with various embodiments of the present disclosure.
Figure 6B:
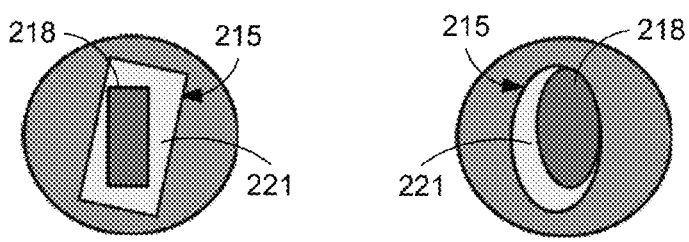

At the bonding temperature, the bonding agent 221 reflows into the gap between the female opening 215 and male extension 218 and fills the joint as shown in FIG. 5C. During relaxation from $T_{bond}$, the distance between the mounting posts 209 returns to the original length as illustrated in FIG. 5D. The keyed catch mechanisms prevent post bond torque shear. FIGS. 6A and 6B illustrate examples of male extensions 218 and female opens 215 that can be used in the catch mechanisms to yield stable post bond locking stability. FIG. 6A shows a rectangular male extension 218 bonded in a corresponding rectangular female opening 215 by the bonding agent 221 and FIG. 6B shows an oval male extension 218 bonded in a corresponding oval female opening 215 by the bonding agent 221. Other shapes or geometric forms that restrict rotation of the male extension 218 within the female opening 215 may also be used.

Referring next to FIGS. 7A-7D, shown are schematic diagrams illustrating the ability of the catch flexure 300 with a single flexible member 212 to adjust for the thermal expansion of the wafers 206 during the bonding process. In FIG. 7A, the catch mechanisms of the catch flexure 300 are aligned during assembly of the wafers 206 at $T_{room}$. As shown, the oval-shaped post of the male extension 218 aligns with the oval-shaped opening of the female opening 215. The initial distance between the mounting post 209 of the flexible member 212 and the oval-shaped post of the male extension 218 attached to the wafer 206 is indicated. As the temperature is increased to $T_{bond}$ during the bonding process, the catch flexure 300 may be stretched. FIG. 7B illustrates the increased distance between the mounting post 209 and male extension 218 produced by the different thermal expansions. As shown, the alignment of the oval shaped post in the oval-shaped opening can vary as the temperature increases to $T_{bond}$. At the bonding temperature, the bonding agent 221 reflows into the gap between the female opening 215 and male extension 218 and fills the joint as shown in FIG. 7C. During relaxation from $T_{bond}$, the distance between the mounting post 209 and male extension 218 returns to the original length as illustrated in FIG. 7D. The keyed catch mechanisms prevent post bond torque shear.

Figure 8A:
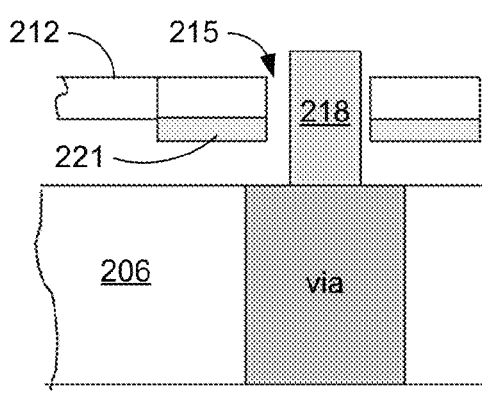
FIGS. 8A-8F illustrate examples of bonding agent location on catch mechanisms, in accordance with various embodiments of the present disclosure.
Figure 8B:
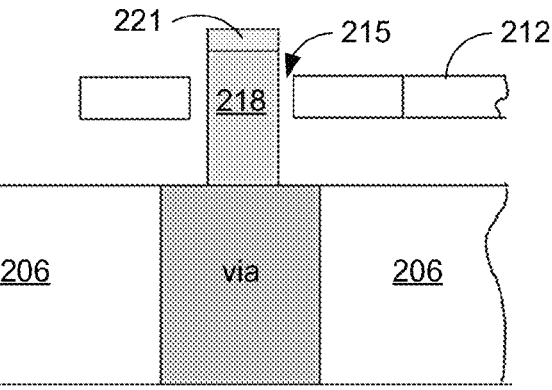
Figure 8C:
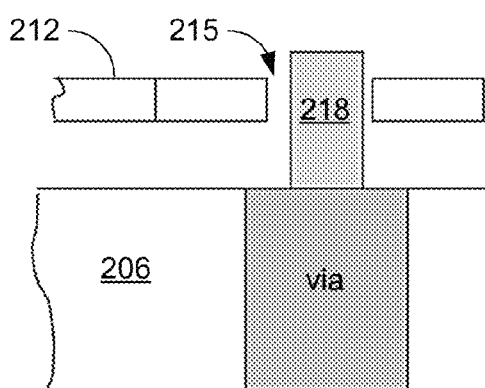
Figure 8D:
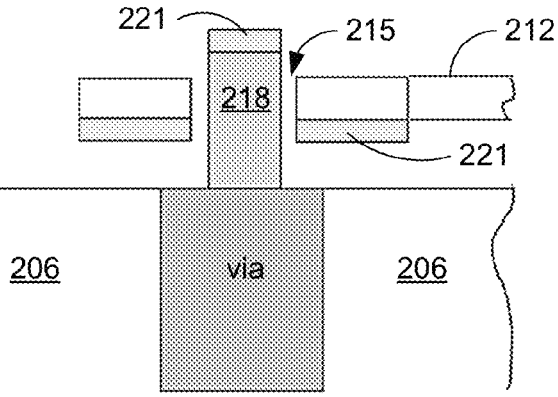
Figure 8E:
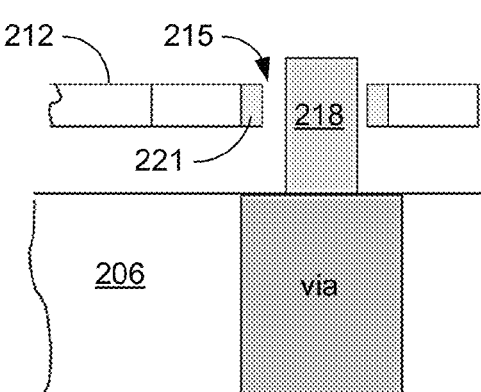
Figure 8F:
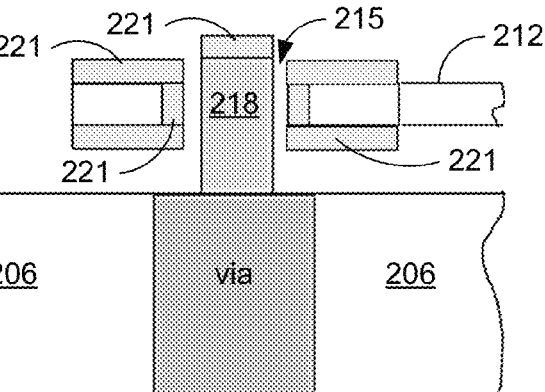

FIGS. 8A-8F illustrate examples of the bonding agent 221 disposed on and/or about the male extension 218 and/or the female opening 215. In some embodiments, the bonding agent 221 can be disposed on the bottom surface and/or top surface of the catch mechanism about the female opening 215 located at the distal end of the flexible member 212 as shown in FIG. 8A. In other embodiments, the bonding agent 221 can be disposed on the free or distal end of the male extension 218 as shown in FIG. 8B. As shown in FIG. 8C, no bonding agent 221 may be disposed on the capture mechanisms prior to bonding in some implementation such as where a thermal slip fit is used. However, fusion bonding or similar techniques may be needed to fix the male extension 218 in the female opening 215, and this may be more difficult to achieve within acceptable temperature ranges. In various embodiments, the bonding agent 221 can be disposed about the female opening 215 and on the end of the male extension 218 as shown in FIG. 8D. In some embodiments, the bonding agent 221 can be disposed on the inside surfaces of the female opening 215 as shown in FIG. 8E, or in and around the female opening 215 and/or on the male extension 218 as illustrated in FIG. 8F. The bonding agent 221 may also be disposed at other locations or combination of locations as can be appreciated.

While FIGS. 8A-8F illustrate the placement of the bonding agent 221 for a catch flexure with a single flexible member 212, the location of the bonding agent 221 is equally applicable to catch flexures including two flexible members 212. While a catch flexure including a single flexible member 212 offers reduced manufacturing costs, catch flexures including two flexible members 212 provide more compliance travel (throw) than a catch flexure using only one of those flexible members 212. In some implementations, a catch flexure including only a single flexible member 212 can be designed to have a large throw with a larger flexure length or compliance design.

Fabrication of interconnects 203 for the catch flexures can be based upon copper damascene plating with the usual array of steps. The process can allow for at least three to four metal layers; the post, the planar flexure and the termination feature which may comprise a post as the male extension 218 on a first wafer 206 and a metal coating on the donut of a second wafer 206, for example. Dielectric layers may be used as a material on the backside of the wafers 206, for example, in and around through wafer vias such as through silicon vias (TSVs). An example of a three mask process for a post-cantilever-post plating process is presented in U.S. Pat. No. 8,766,449 (Variable Interconnect Geometry for Electronic Packages and Fabrication Methods), which is hereby incorporated by reference in its entirety.

Figure 9A:
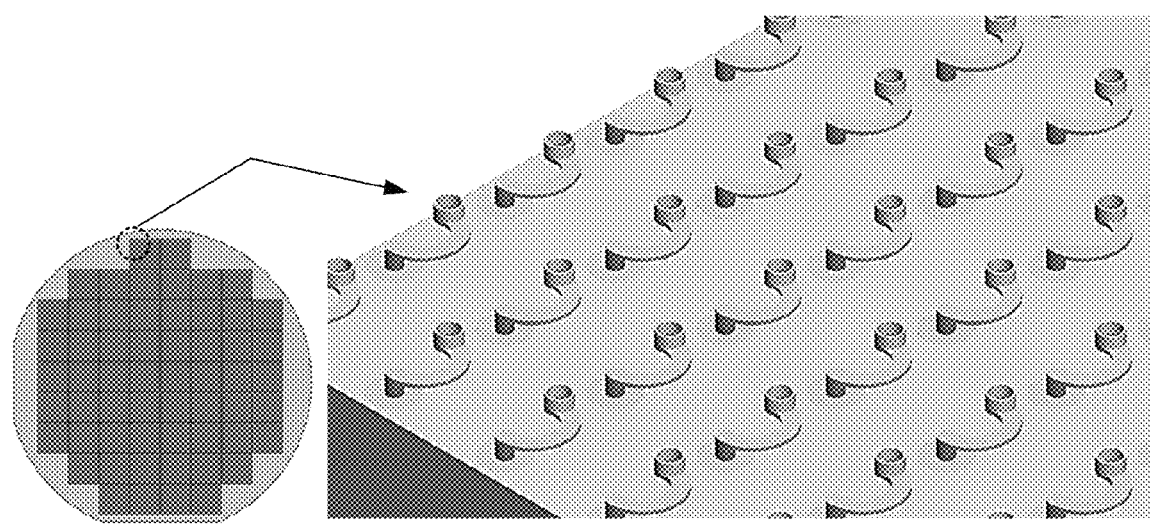
FIGS. 9A-9F graphically illustrate examples of arrays of female and male interconnections for the catch flexures of FIGS. 3A-3C and 4A-4C, in accordance with various embodiments of the present disclosure.
Figure 9B:
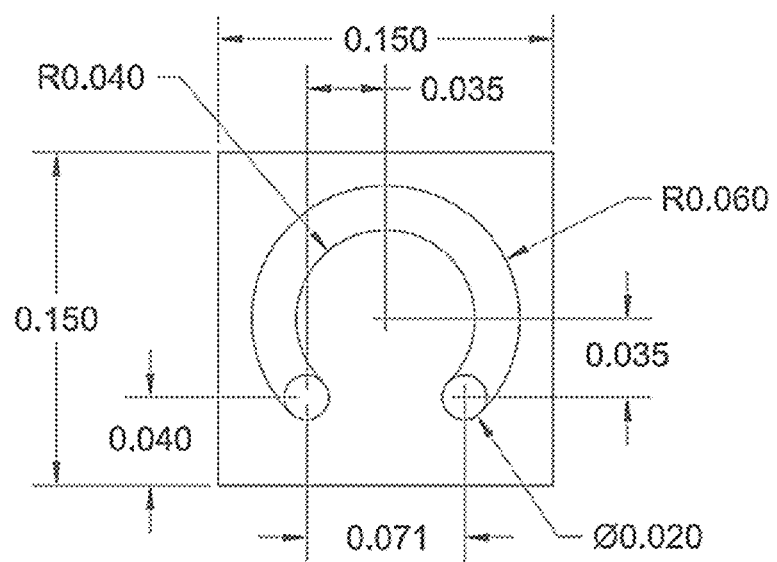
Figure 9C:
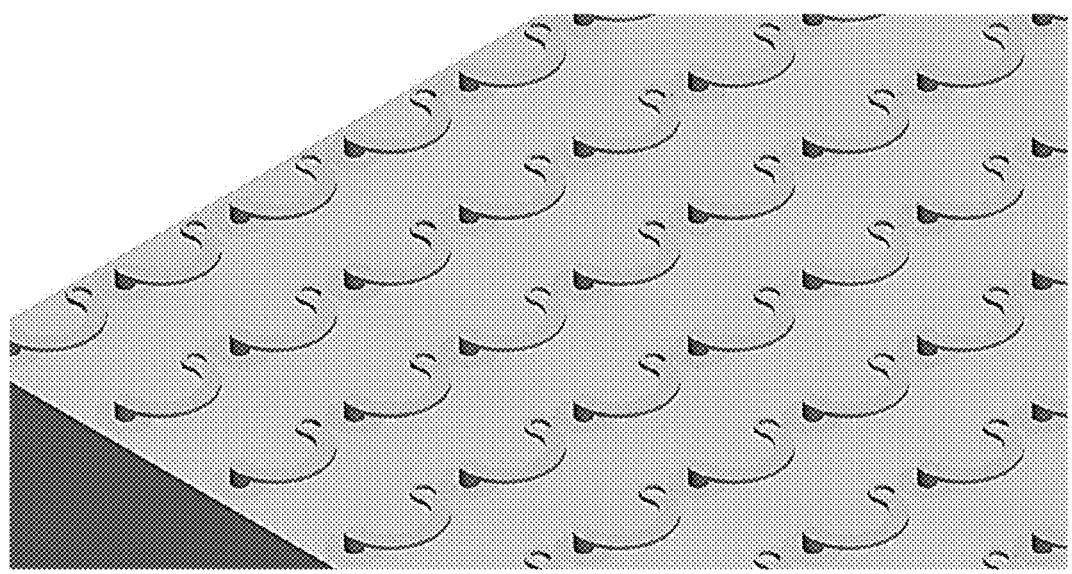
Figure 9D:
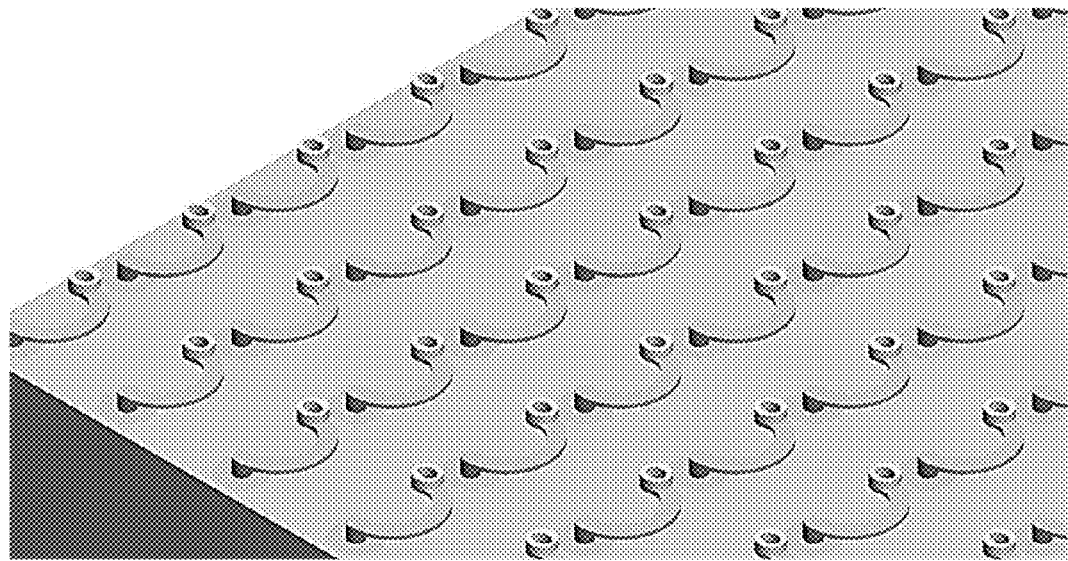
Figure 9E:
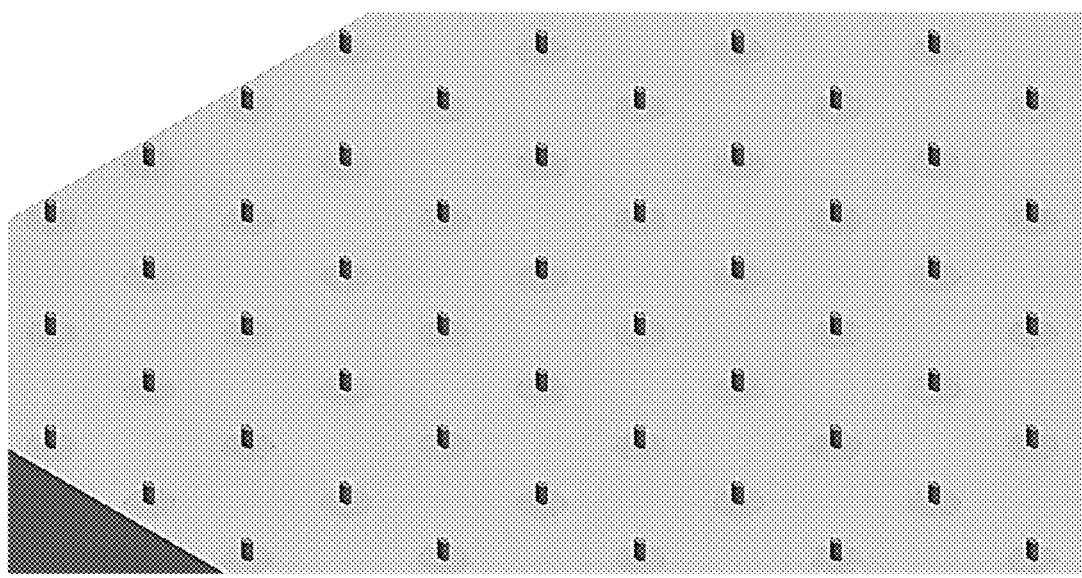
Figure 9F:
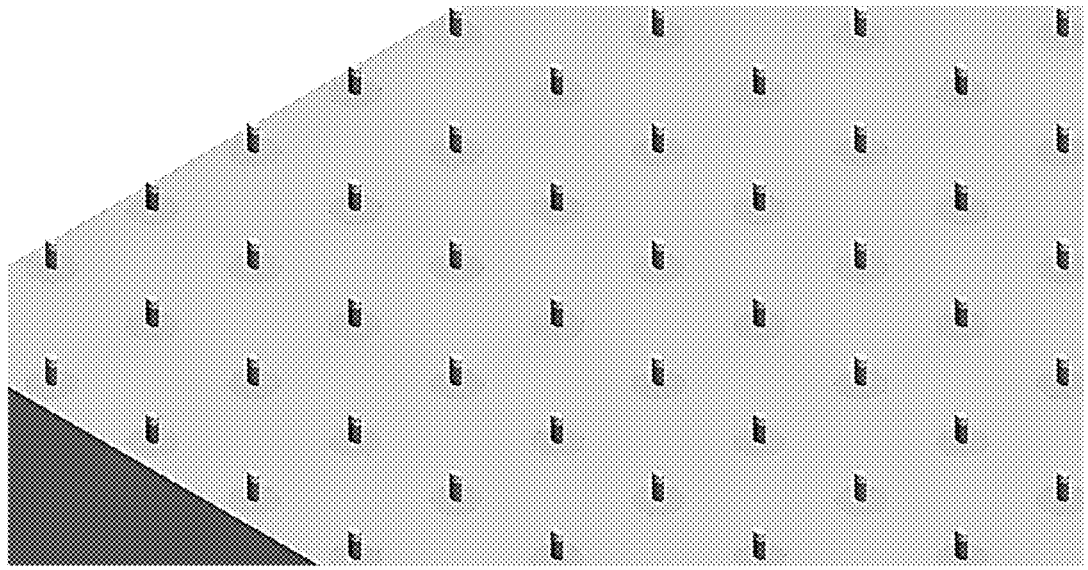

The process for the female opening 215 can be a two to four level mask process before the bonding metallization. The bonding agent 221 may be deposited on the catch mechanism through bonding metallization using evaporation or sputtering. The PVD processing offers a wide choice of materials to work with, but some may utilize another mask step. FIG. 9A illustrates an example of a wafer layout with an array of female interconnects 203. For example, the proposed implementation can include 58 of the 1.5 mm chips or die on a wafer 206. In one embodiment, among others, the wafer 206 shown in FIG. 9A can include 501,642 connections with each chip or die including 8,649 connections. FIG. 9B shows in example of a layout for an interconnect 203 with a 150 μm cell. FIGS. 9C and 9D illustrate an example of female interconnects 203 on a wafer 206 without a bonding agent 221 applied and after deposition of the bonding agent 221 about the female opening 215, respectively. FIGS. 9E and 9F illustrate an example of male interconnects 303 on a wafer 206 without a bonding agent 221 applied and after deposition of the bonding agent 221 on the end of the male extension 218, respectively.

Figure 10:
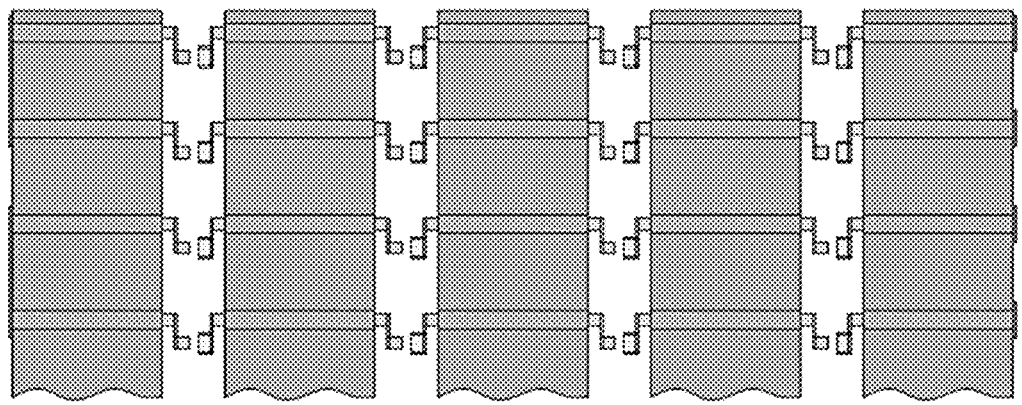
FIG. 10 is a graphical representation of a stack of five wafers including catch flexure interconnections between the wafers, in accordance with various embodiments of the present disclosure.

In one implementation, among others, the wafer and device layout requirements include a minimum of 500,000 interconnects with a yield of at least 99% though a five wafer heterogeneous substrate material system. With each chip having more than 8,000 connections, each resulting chip stack will comprise 5 levels of interconnection. For instance, the wafers can include a GaAs wafer, a silicon wafer (e.g., a TSV or RDL (redistribution layer) wafer), a GaN/Si wafer, a GaN/SiC wafer and a glass or sapphire wafer. The wafers can include vias passing through the wafer for connections. FIG. 10 is a graphical representation illustrating the back-to-back connections between the five wafers 206 using catch flexures with flexible member 212 with corresponding male and female catch mechanisms such as the example in FIGS. 2A and 2B. In other implementations, catch flexures including a single flexible member 212 such as the examples of FIGS. 3A-3C and 4A-4C can be utilized.

Figure 11:
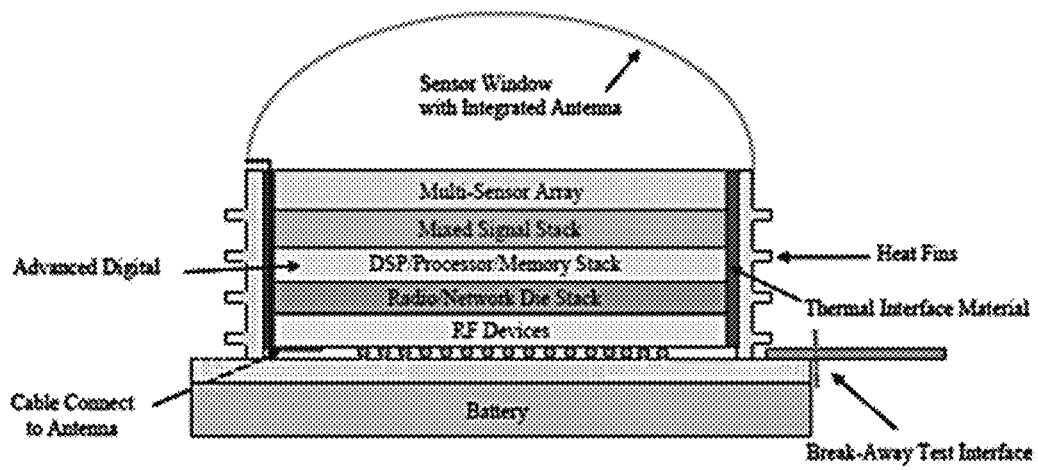
FIG. 11 is an example of a sensor system that can utilize catch flexures for interconnection between different sensor and device wafers, in accordance with various embodiments of the present disclosure.

The catch flexure offers advantages for the stacking and interconnection of heterogeneous multi-wafer systems, such as wafers made from different substrates materials, but can also be applied at the chip stacking (or chip-to-chip bonding) level if the need arises. Wafers in multi-wafer systems can include RDL wafers or layers. Catch flexures can be applied to electronic devices, mechanical devices, sensor devices, emitter device and any device that is made with what is understood as wafer scale fabrication. Vertically stacked chip level systems which require CTE compliance because of the used of different substrate materials can benefit from the disclosed assemblies. For example, catch flexures can be used in sensor systems such as the example illustrated in FIG. 11, where the layers include different sensors and signal processing, which can be based on the use of different materials. The ability to adjust for operational heating also is beneficial to such systems.

Testing of the catch flexures can be carried out at the die or chip level. The wafers can be designed with 1.5 cm chips, which can match Harris designs having heaters and thermocouples. This feature can be advantageous to confirm thermal cycling fatigue. In addition, some of the interconnections can be serialized into groups of 100, only 80 manual measurements need to be made for each chip stack.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A catch flexure assembly, comprising:
 a first interconnect affixed to a first wafer, the first interconnect including a female opening at a distal end of a flexible member that extends from a mounting post at a proximal end, the female opening configured to:
  receive a male extension of a second interconnect affixed to a second wafer when the first wafer is aligned with the second wafer, the male extension having a substantially uniform cross-section along its axial length; and
  retain the male extension during a bonding process of the first and second interconnects; and
 bonding material disposed adjacent to the female opening, the bonding material configured to secure the male extension in the female opening during the bonding process.

2. The catch flexure assembly of claim 1, wherein engagement of the male extension with the female opening is maintained during planar motion experienced between the first and second wafers during the bonding process.

3. The catch flexure assembly of claim 1, wherein engagement of the male extension with the female opening is maintained during vertical motion experienced between the first and second wafers during the bonding process.

4. The catch flexure assembly of claim 1, wherein the second interconnect includes the male extension at a distal end of a flexible member that extends from a mounting post at a proximal end.

5. The catch fixture assembly of claim 1, wherein the first wafer and the second wafer comprise different materials.

6. The catch fixture assembly of claim 1, wherein the female opening is a cross-shaped opening and the male extension is a cross-shaped post.

7. The catch fixture assembly of claim 1, wherein the female opening is a blade-shaped opening and the male extension is a blade-shaped post.

8. The catch fixture assembly of claim 1, wherein the female opening is an elliptical-shaped opening and the male extension is an elliptical-shaped post.

9. A chip stack comprising the catch flexure assembly of claim 1.

10. A wafer stack comprising the catch flexure assembly of claim 1.

11. The catch fixture assembly of claim 1, wherein the mounting post extends outward from a surface of the first wafer, and the flexible element extends from the mounting post substantially parallel with the surface of the first wafer.

12. A catch fixture assembly, comprising:
 a first interconnect affixed to a first wafer, the first interconnect including a female opening at a distal end of a flexible member, where the flexible member is a C-shaped arm extending from a mounting post at a proximal end to the female opening at the distal end, the female opening configured to:
  receive a male extension of a second interconnect affixed to a second wafer when the first wafer is aligned with the second wafer; and
  retain the male extension during a bonding process of the first and second interconnects; and
 bonding material disposed adjacent to the female opening, the bonding material configured to secure the male extension in the female opening during the bonding process.

13. The catch flexure assembly of claim 12, wherein engagement of the male extension with the female opening is maintained during planar motion experienced between the first and second wafers during the bonding process.

14. The catch flexure assembly of claim 12, wherein engagement of the male extension with the female opening is maintained during vertical motion experienced between the first and second wafers during the bonding process.

15. The catch flexure assembly of claim 12, wherein the second interconnect includes the male extension at a distal end of a flexible member that extends from a mounting post at a proximal end.

16. The catch fixture assembly of claim 12, wherein female opening is a cross-shaped opening and the male extension is a cross-shaped post.

* * * * *